United States Patent
Furuyama

[19]

[11] Patent Number: 6,091,147
[45] Date of Patent: Jul. 18, 2000

[54] CONNECTOR TYPE SEMICONDUCTOR PACKAGE

[75] Inventor: Hideto Furuyama, Yokohama, Japan

[73] Assignee: Kabushiki Kaisha Toshiba, Kawasaki, Japan

[21] Appl. No.: 09/030,959

[22] Filed: Feb. 26, 1998

[30] Foreign Application Priority Data

| Feb. 28, 1997 | [JP] | Japan | 9-046693 |
| Apr. 16, 1997 | [JP] | Japan | 9-098920 |

[51] Int. Cl.[7] ............ H01R 9/00; H01R 23/72; H01R 31/08; H03K 13/24
[52] U.S. Cl. ............ 257/730; 257/666; 257/693; 257/692; 257/698; 257/724; 257/731; 257/727; 361/772; 439/670; 439/347; 439/159; 439/845; 439/849
[58] Field of Search ............ 257/678, 686, 257/723, 666, 692, 693, 724, 685, 690, 726, 730, 698, 700, 725–733; 361/772, 777; 439/620, 347, 159, 845, 849

[56] References Cited

U.S. PATENT DOCUMENTS

| 4,810,215 | 3/1989 | Kaneko | 439/845 |
| 4,895,425 | 1/1990 | Iwano et al. | 385/60 |
| 4,992,052 | 2/1991 | Verhoeven | 439/62 |
| 5,112,239 | 5/1992 | Yagi et al. | 439/189 |
| 5,190,461 | 3/1993 | Oorui et al. | 439/63 |
| 5,258,649 | 11/1993 | Tanaka et al. | 257/787 |
| 5,269,692 | 12/1993 | Takahashi | 439/74 |
| 5,507,661 | 4/1996 | Honda et al. | 439/347 |
| 5,616,034 | 4/1997 | Masuda et al. | 439/78 |
| 5,646,827 | 7/1997 | Hirao et al. | 361/707 |
| 5,667,393 | 9/1997 | Grabbe et al. | 439/83 |
| 5,742,480 | 4/1998 | Sawada et al. | 361/749 |
| 5,758,931 | 6/1998 | Hio et al. | 303/119.2 |

OTHER PUBLICATIONS

R. A. Nordin, et al., "High Performance Optical Datalink Array Technology", IEEE Transactions on Components, Hybrids, and Manufacturing Technology, vol. 16, No. 8, Dec. 1993, pp. 783–788.

*Primary Examiner*—Alexander Oscar Williams
*Attorney, Agent, or Firm*—Oblon, Spivak, McClelland, Maier & Neustadt, P.C.

[57] ABSTRACT

A connector type semiconductor package having a package mounting surface on a package main body, the connection direction of a signal connection connector being parallel to the package mounting surface, the package comprising a connector insertion portion provided in the package main body, the signal connection connector detachably inserted into the connector insertion portion, surface mount type electrical connection terminals provided at the package main body, and a step provided at a side where the connector insertion portion of the package main body is provided, for determining the height of the surface mount type electrical connection terminals.

26 Claims, 5 Drawing Sheets

CONNECTOR TYPE SEMICONDUCTOR PACKAGE

BACKGROUND OF THE INVENTION

1. Field of the Invention

The present invention relates to a connector type semiconductor package including cable connection interface ICs and optical semiconductor devices for optical interconnection and the like, and detachably connecting a signal connection connector such as an optical connector and the like.

2. Description of the Related Art

Recently, the number of personal information equipment have been rapidly increased and the demand for a great increase in the information communications capacity rises. Further, digital image information processing has been normally conducted. In this way, large amounts of data of information equipment and of communications equipment have been processed. Particularly in a server for receiving and transmitting information transmitted from terminal systems and a communication exchange system for constructing a network, the lack of processing capacity and of communications capacity has become a serious problem.

Only an improvement in LSI processing speed of, for example, a processor is not enough to process such high capacity information. It is necessary to conduct multiprocessing such as parallel processing and distributed processing using many processor LSI circuits. Therefore, in many cases, lots of LSI circuits are combined and used in a single processing unit in a core information processing system or information exchange system. Additionally, in these systems, even a single architectural unit cannot be mounted on a single board and is frequently needed to be mounted on multiple boards or, in some cases, multiple racks. For that reason, wiring between boards and between racks becomes one of primary factors for determining processor capability. It is therefore important to secure the capacity of wiring members.

Normally, since interface circuits for wiring members between racks are mounted on boards, wiring between racks may be referred to as wiring between boards in a broader sense. The mounting technique at the time of wiring between boards is substantially significant. So is the performance of circuits and parts installed on board ends as well as transmission paths to be connected thereto.

Boards are mounted on a rack by connecting connector so as to enable maintenance, repairs and replacement in units of boards. A bookshelf mounting is a best known method for mounting. According to the method, mounting boards are mounted like a bookshelf on a back plane board which includes wiring members for bridging wiring members between boards and a board installation connector. Wiring outside the back plane board, i.e., wiring between racks is conducted using ribbon cables and coaxial cables through the connector.

The wiring members between boards transmit and receive signals which are processed on the boards without change if transmission speed is relatively slow and the distance is short. Meanwhile, if the distance is long, the speed is fast and wiring is laid out in a wide range, then the wiring members amplify and transmit signals and receive signals after processing them such as amplification or waveform shaping. The higher the signal frequency is, the more frequently the electrical signals are buried into noises and the bigger the transmission loss of connection paths becomes. It is necessary to prevent the signals from being buried into noises and to compensate the loss. For that reason, high speed, large capacity wiring members as mentioned above require interfaces for amplification and waveform shaping on board ends to ensure wiring between the boards.

Optical wiring characterized in that signal paths are non-inductive and that grounding is not necessary, is recently intended to be used for high speed wiring which is difficult to conduct by electrical wiring and for wiring in the environment surrounded by frequent electromagnetic noises. In this case, converting parts for converting an optical signal into an electrical signal is required. In addition, interfaces are required as in the case of the above-stated high speed electrical wiring.

Normally, interface circuits for electrical wiring between boards are ICs. They are mounted on the boards and input/output sections thereof are connected to a signal connection connector on board ends. In that case, however, mounting areas on the boards are reduced since areas for the interface circuits are necessary. Thus, additional boards are required. This results in an increase in wiring members between boards, an increase in the overall wiring length and therefore a decrease in system performance. To reduce the mounting area of the interface circuits and to reduce the number of parts, an active connector wherein interface ICs are installed in a signal connection connector has been developed and put to practical use.

In case of optical wiring, meanwhile, photoelectric transfer devices are always used whether interface ICs are installed or not. Due to this, optical semiconductor devices are usually mounted on a connector portion. In this case, too, it is advantageous that all semiconductor devices are installed into the connector portion to secure the mounting areas on the boards. Actually, optical wiring parts having interface circuits installed thereinto have been put to practical use.

FIG. 1 illustrate a connector portion having interface semiconductor devices installed thereinto, that is, a semiconductor package including a connector (which will be referred to as a "connector type semiconductor package" hereinafter). In FIG. 1, a connector insertion portion 3, a connector lock hole 4 and electrical terminals 11 for supplying electrical signals and power are provided in a package main body 1. Interface ICs and optical semiconductor devices are mounted inside the package main body 1.

In the package including interface circuits, the outline of electrical wiring can be made the same as that of optical wiring. Accordingly, description will be given to wiring hereinafter without particularly differentiating electrical and optical wiring.

The connector type semiconductor package shown in FIG. 1 is a so-called terminal insertion type package. That is, in the package, through holes for use as both insertion holes and as wiring terminals are provided in mounting boards to insert and mount parts into the boards. The mounting manner is similar to that of a DIP (Dual In-line Package) and advantageous to the connector type package since the mechanical alignment of part mounting positions on the board is possible and the mounting strength is large.

However, the insertion type package is disadvantage in that it requires through holes on the mounting substrate and that the signal terminal density cannot be very high. In other words, even if narrow print wiring pitches on the mounting boards are possible, it is necessary to widen wiring pitches on the connector portion. Compared with wiring density on a single board, the wiring density between boards become small. Owing to this, if a processor unit bridging a plurality of boards is to be constructed, widths of bus lines (or the number of signal lines and signal speeds) on the boards and those between boards become inconsistent. This possibly causes problems to system configuration.

To solve the problems, it is desired to realize a package capable of including many terminals to be connected on boards. The same thing is true of the board mounting of LSI circuits. That is why the package form of LSI circuits is changed with the times. There is proposed a surface mount type package wherein far more connection terminals can be provided than the conventional insertion package shown in FIG. 1.

The surface mount type package is characterized in that parts can be mounted only by providing installation patterns for, example, soldering on surfaces of boards as the name shows and that no through holes are required on the mounting boards. Therefore, in case of the surface mount type package, another circuits can be mounted on back surfaces of the boards, thereby making it possible to realize two-fold mounting density. Moreover, because of few constraints to mechanical density unlike through holes, the surface mount type package is capable of increasing terminal density so far as electrical characteristics, the package installation technique (soldering technique) and the like permit. This makes it possible to provide signal terminals of the same density as that of the wiring members on mounting boards. As a result, the wiring density on boards can be made same as that between boards.

As surface mount type LSI packages, SOP (Small Outline Package), QFP (Quad Flat Package), BGA (Ball Grid Array) can be cited. It is considered that they can be easily used as connector type semiconductor packages.

FIG. 2 illustrates a case where the surface mount type LSI package is applied to a connector type semiconductor package. FIG. 2 represents the work of the inventors of the present invention and is disclosed in this section to explain the background of the invention, and is not an admission that FIG. 2 represents prior art. As shown in FIG. 2, a package main body 1 is provided with signal connection terminals 2. A connector lock key 13 is provided on one end of a cable connector 12 from which the cable connector 12 is inserted into the package main body 1. A signal wiring cable 14 is provided on the other end of the cable connector 12. This exemplifies the above-stated QFP type package. The terminals 2 are fixedly soldered to print wiring members independently of one another, thereby realizing high density terminal connection.

It is simplest to provide the same number of the wiring members in the cable 14 as that of the terminals connected to the connector type package. However, if a signal multiplexing circuit is incorporated into an interface circuit, the number of wiring members within the cable which are actually connected to the package can be reduced. The method is particularly easy to use for optical wiring and is advantageous to the realization of smaller space and lighter weight of the wiring cable while maintaining the same wiring capacity as that on boards.

As described above, the connector type semiconductor package is effective means for wiring interface parts such as wiring between boards. Nonetheless, the above-stated conventional connector type semiconductor package has the following problems.

The surface mount type LSI package is normally arranged line-symmetrically (SOP) or point-symmetrically (QFP, BGA) about the center of the package. The reason is the adoption of a method for pressing the package against boards during mounting and for collecting slightly uneven shapes of respective connection terminals by deforming the terminals (leads or balls) altogether so as to ensure that all of the many narrow pitch connection terminals can be soldered to the mounting boards, respectively in a uniform manner.

Accordingly, if simply using the surface mount type LSI package as shown in FIG. 2 as a connector type semiconductor package, then terminal arrangement symmetry is thrown into disorder and problems typical of the surface mount type LSI package occur. That is, the package is inclined toward the connector side by the application of pressure onto the package during mounting and soldering defects tend to occur to connection terminals on the surface facing the connector surface. Furthermore, the QFP type connection terminals shown in FIG. 2 have lead terminals only in three directions which should be four directions. The package tends to be pressed and shifted (pressure shift) by a group of connection terminals arranged on the surface facing the connector after the application of pressure onto the package during board mounting.

The surface mount type package is fixed to surfaces of the mounting boards only by soldered joint, as the name tells. Therefore, the fixing strength larger than connector disconnect force is not necessarily secured even if auxiliary adhesive is used sometimes. Even though the package fixing strength larger than the connector disconnect force is ensured, stress is given to the connection terminals as a result of connector disconnect and tension generated by providing the connection cable. This lead to an increase in connection deteriorating phenomena such as a solder creep. In other words, the connection reliability of connection terminals might be badly affected, reliability of parts and mounting might be deteriorated and thus the system reliability might be considerably lowered.

BRIEF SUMMARY OF THE INVENTION

It is therefore an object of the present invention to overcome the problems of terminal connection defects and mounting position shifts during board mounting, and to provide a surface mounting and connector type semiconductor package which can be used without applying stress resulting from connector disconnect onto the connection terminals.

The above object can be attained by the following connector type semiconductor package. A connector type semiconductor package having a package mounting surface on a package main body, a connection direction of a signal connection connector being parallel to the package mounting surface, the package is characterized by comprising:

a connector insertion portion provided at the package main body, the signal connection connector detachably inserted into the connector insertion portion;

a surface mount type electrical connection terminals provided at the package main body; and a step provided at a side where the connector insertion portion of the package main body is provided, for determining a height of the surface mount type electrical connection terminals.

According to the present invention, it is possible to prevent the package from being inclined toward the connector side if the pressure is applied onto the package during board mounting and to ensure soldering the surface mount type electrical connection terminals by providing a step determining the height of the surface mount type electrical connection terminals at a side where the connection insertion portion is provided. Moreover, a screw installation hole or screw hole is provided for securing the mounting fixation strength of the signal connection connector and the step is provided in the vicinity of the screw installation hole or screw hole. By so doing, the problem that the package is inclined during package mounting can be overcome. In addition, it is possible to prevent external force from being applied to the connection terminals by converging fixing force by the screw installation into the periphery of the screw installation hole or screw hole. Moreover, it is possible to apply pressure in a uniform manner to the package during package mounting by setting the height of the step to those of the electrical connection terminals after package mounting.

The above object can be also attained by the following connector type semiconductor package. A connector type semiconductor package having a package mounting surface on a package main body, a connection direction of a signal connection connector being parallel to the package mounting surface, the package is characterized by comprising:

a connector insertion portion provided in the package main body, the signal connection connector detachably inserted into the connector insertion portion; and lead type electrical connection terminals arranged asymmetrically around the package main body and each having a deformed portion provided to prevent a tip end portion of the terminal from contacting with the package mounting surface.

According to the present invention, surface mount type electrical connection terminals are formed of leads and tip end portions of the leads are deformed to prevent them from contacting with the mounting surface of the package mounting substrate. It is possible to prevent mounting position from being shifted by making lead deformation smoothly by the application of pressure to the package during mounting. Further, it is possible to improve connection reliability by providing two lead contact portions by solder surface tension.

The above object can be further attained by the following connector type semiconductor package. A connector type semiconductor package having a package mounting surface on a package main body, a connection direction of a signal connection connector is parallel to the package mounting surface, the package is characterized by comprising:

a connector insertion portion provided in the package main body, the signal connection connector detachably inserted into the connector insertion portion;

surface mount type electrical connection terminals provided at the package main body;

a step provided at a side where a connection insertion portion of the package main body is provided, for determining a height of the surface mount type electrical connection terminals; and a fixing auxiliary terminal provided at the package main body and capable of being fixed simultaneously with the surface mount type electrical connection terminals.

According to the present invention, a screw installation hole or a screw hole is provided for securing the mounting fixation strength of the signal connection connector and an auxiliary terminal capable of being fixed simultaneously with the surface mount type electrical connection terminals is provided. Thereby, it is possible for the auxiliary terminal to absorb torsion given at the time of screw fixing the package to the board. It is also possible to further improve connection reliability by reducing stress applied to the connection terminals at the time of screw fixing the package to the board.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail with reference to the embodiment drawings.

As already described above, the specification of the outline of the semiconductor package can be made same between the electrical wiring connector type and the optical wiring connector type. Although no individual description will be given, it goes without saying that the following description is applicable to both cases. Here in the description, the above-stated QFP type surface mount type package is illustrated. It can be easily understood that the description is applicable to the SOP type, the BGA type and other surface mount type packages.

[First Embodiment]

Figure 1:
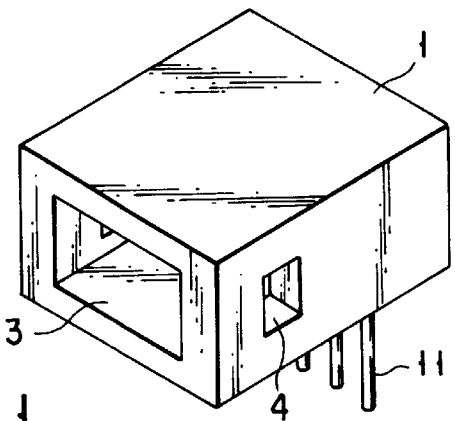
FIG. 1 is a perspective view showing the structure of the connector type semiconductor package of prior art.
Figure 2:
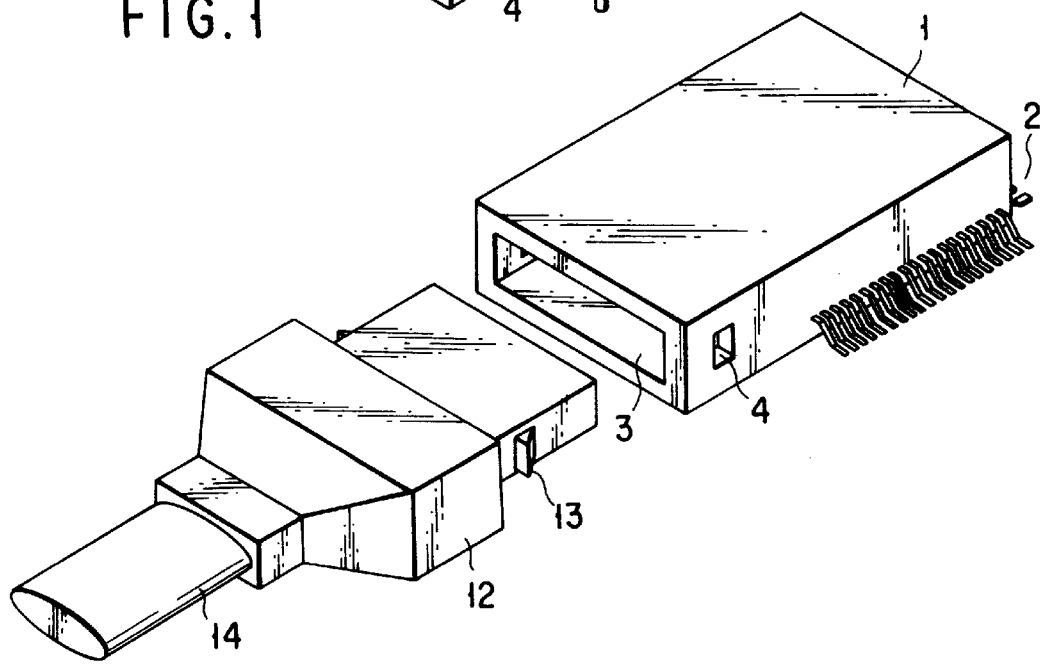
FIG. 2 is a perspective view showing the structure of the connector type semiconductor package of related art.
Figure 3:
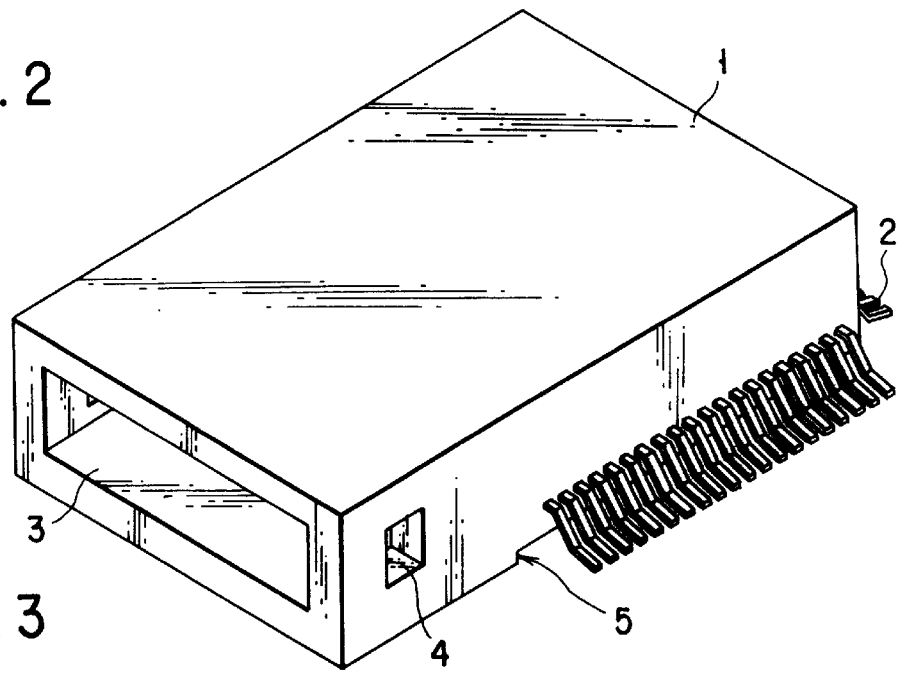
FIG. 3 is a perspective view showing the structure of the connector type semiconductor package in the first embodiment according to the present invention.

FIG. 3 is a perspective view showing the structure of the appearance of the connector type semiconductor package in the first embodiment according to the present invention. As shown therein, terminals 2 each having the same shape as that of a so-called gull-wing type lead terminal which is a surface mounted type electrical connection terminal used for the normal QFP, a connector receptacle 3 which is a signal connection connector insertion portion, a connector lock hole 4 and a step 5 for determining the height of the electrical connection terminal 2 are provided in a package main body 1.

The connector type semiconductor package with this structure is capable of mounting terminals as well as the normal LSI package on boards using automated mounting equipment without causing soldering defects to a group of connection terminals on the surface facing the connector by setting the height of the step 5 such that the package surface is made level with mounting substrates by the application of pressure during packaging.

At this time, methods for mounting terminals as well as the normal LSI package on boards include a method for solder-reflowing parts of mounting boards altogether after they are aligned by automated mounting equipment and fixed by adhesive, and a method for sequentially mounting using a QFP mounter. Since the appropriate degree of modification of the connection terminals 2 varies depending on the mounting method, it is only necessary to set the height of the step 5 depending on the used mounting equipment and steps. Specific example will be now described with reference to FIGS. 4A and 4B.

Figure 4A:
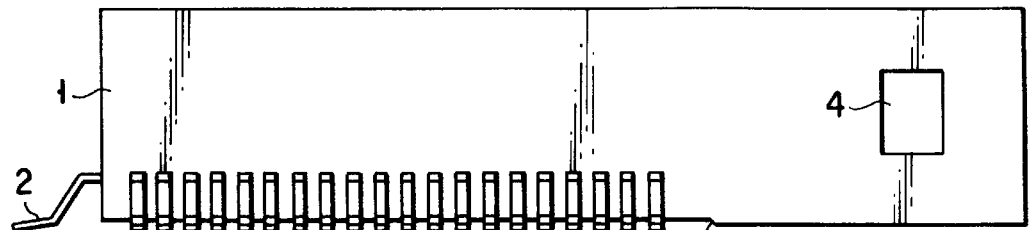
FIG. 4A is a side view of the connector type semiconductor package in the first embodiment.
Figure 4B:
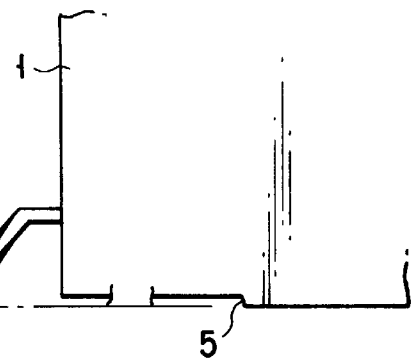
FIG. 4B is a partly enlarged view of the connector type semiconductor package in the first embodiment.

FIG. 4A is a side view of the connector type semiconductor package shown in FIG. 3. FIG. 4B is an enlarged view showing that the step 5 is parallel displaced to the terminal 2 on the rear end portion while terminals therebetween are not shown. The terminals arranged on the side surface of FIG. 4A are the same in shape as the terminals 2 on the package rear portion. The number of terminals if combining those on the side surface and those on the rear surface amounts to 60.

In case of providing many terminals as mentioned above, it is preferable to utilize the sequential mounting method rather than the reflow mounting method from the viewpoint of mounting alignment accuracy. FIG. 4B shows the state of the terminal 2 (broken line) which is to be mounted on a board. After mounting the terminal 2 on the board, the terminal 2 deformed into 2' (full line) by the pressure applied onto the package and fixed by soldering. By the deforming, nonuniform molds of respective terminals can be collected altogether. In FIG. 4B, reference numeral 6 denotes the position of the board surface when the terminal is mounted on the board. The step 5 directly contacts with the board and supports the front end of the package.

Before the package is mounted, the specific dimension of the terminal 2 is set at, for example, 0.1 mm such that the uppermost portion of the board connection part (portion curved downward) is positioned equal to the lower surface of the package or slightly lower than it in view of an allowance. The board connection part of the rear terminal 2 (tip end flat portion) is set to have a slight angle downward such that the board connection part of the lead terminal 2 is surely brought into contact with the board mounting surface by applying pressure onto the package during mounting.

By deforming the lead terminal thus set after mounting (2'), a large part of the package is slightly floating from the board surface. The floating degree of the package at that time is about 0.1 mm in the above example, although variable with conditions. Thus, the height of the step 5 may be 0.1 mm.

[Second Embodiment]

Figure 5A:
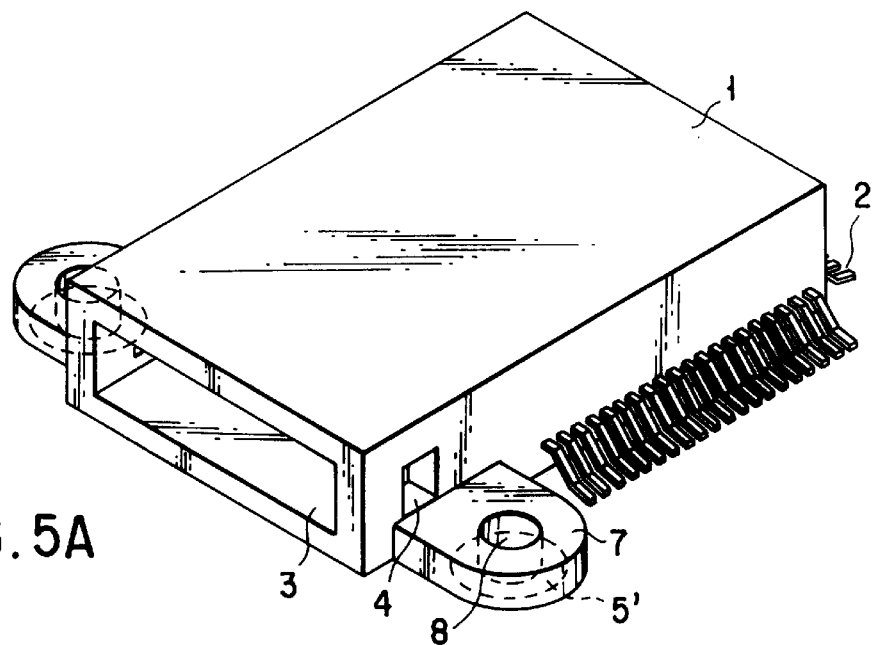
FIG. 5A is a perspective view of the connector type semiconductor package in the second embodiment according to the present invention.
Figure 5B:
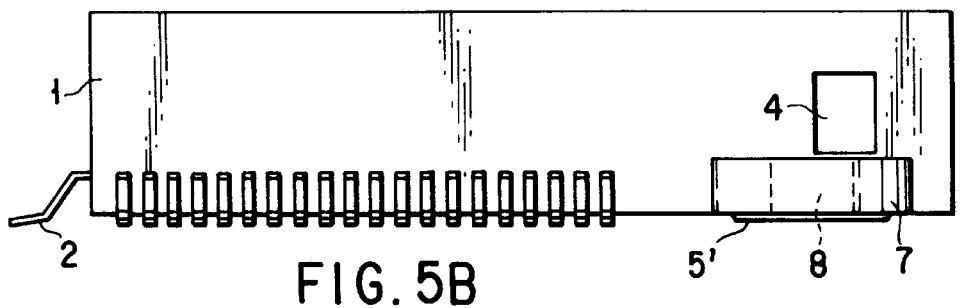
FIG. 5B is a side view of the connector type semiconductor package in the second embodiment.

FIG. 5A is a perspective view showing the structure of the appearance of the connector type semiconductor package in the second embodiment according to the present invention. FIG. 5B is a side view thereof. As shown in FIGS. 5A and 5B, terminals 2 each having the same shape as that of a so-called gull-wing type lead terminal which is a surface mount type electrical connection terminal used for the normal QFP, a connector receptacle 3 which is a signal connection connector insertion portion, a connector lock hole 4, a step 5' for determining the height of the electrical connection terminal 2, a fixing portion 7 for screw-fixing the package to the board and a screw hole 8 are provided in a package main body 1.

The second embodiment illustrates a case where package installation strength as a connector is improved and the external force during connector disconnect is received by the fixing portion 7. This embodiment is capable of providing more practical board mount strength than the first embodiment. This embodiment is also characterized in that the step 5' is provided in the vicinity of the screw hole 8 of the fixing portion 7 to thereby converge the pressure for fixing the package to the board into the screw fixing portion and to prevent the external force from the connector from being transmitted to the electrical connection terminal 2.

Accordingly, the same effect can be of course attained in this embodiment as that in the first embodiment. Beside, the connection reliability of the electrical connection terminals 2 can be made equal to that of the normal LSI package in this embodiment.

[Third Embodiment]

Figure 6A:
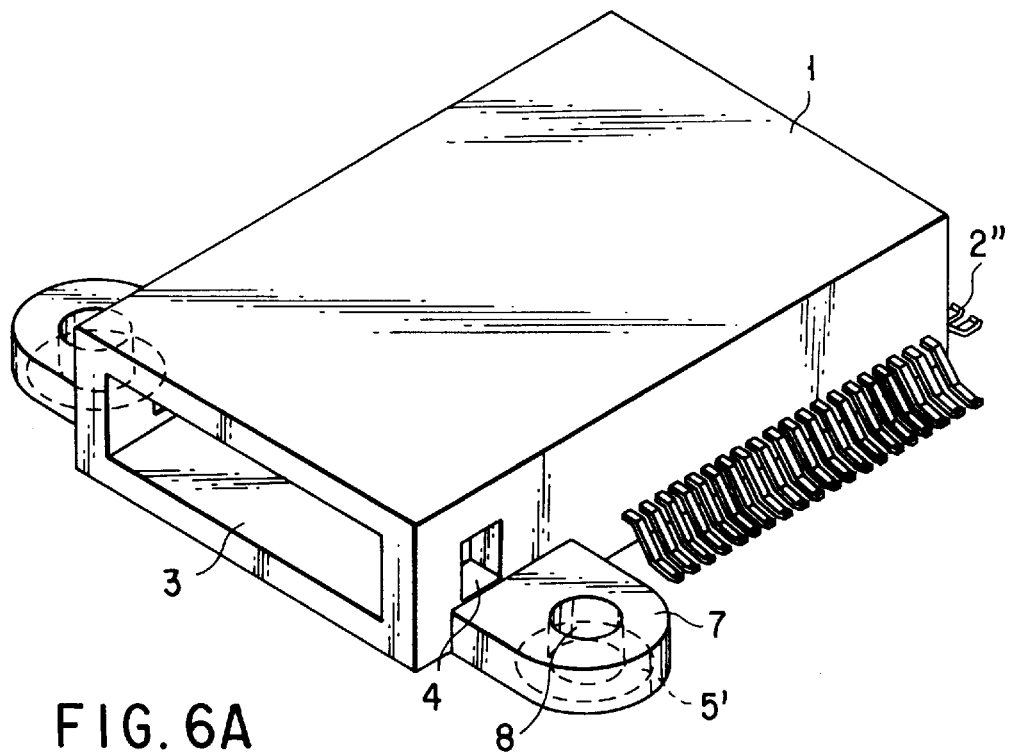
FIG. 6A is a perspective view showing the structure of the connector type semiconductor package in the third embodiment according to the present invention.
Figure 6B:
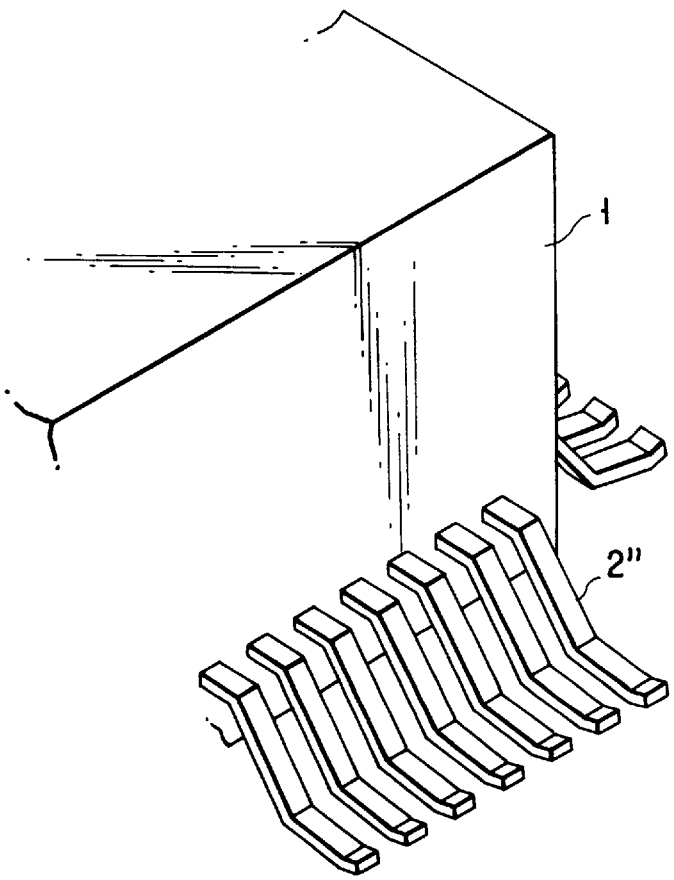
FIG. 6B is a partially enlarged view showing the structure of the connector type semiconductor package in the third embodiment.

FIG. 6A is a perspective view showing the structure of the appearance of the connector type semiconductor package in the third embodiment according to the present invention. FIG. 6B is an enlarged view of the electrical connection terminal portion. In FIGS. 6A and 6B, terminals 2" each having a deformed tip end portion of that of a so-called gull-wing type lead terminal which is a surface mount type electrical connection terminal used for the normal QFP, a connector receptacle 3 which is a signal connection connector insertion portion, a connector lock hole 4, a step 5' for determining the height of the electrical connection terminal 2, a fixing part 7 for screw-fixing the package to the board (package mounting substrate) and a screw hole 8 are provided in a package main body 1.

This embodiment illustrates a case where the package is prevented from being pressed and moved (position-shifted) by a sequence of terminals, particularly a sequence of rear end terminals during package mounting. As shown in FIG. 4B, lead terminals are deformed by the application of pressure onto the package during mounting. At this time, positions of the lead tip end portions are slid outside of the package as shown in reference numeral 2' of FIG. 4B. The normal QFP has lead terminals in four directions and facing terminal sequences push one another. For that reason, overall positions of the terminals are not shifted. However, if the package has terminal sequences only in three directions, such a phenomena that the overall sequences are shifted in the direction where no sequence is provided can be often seen.

Figure 7:
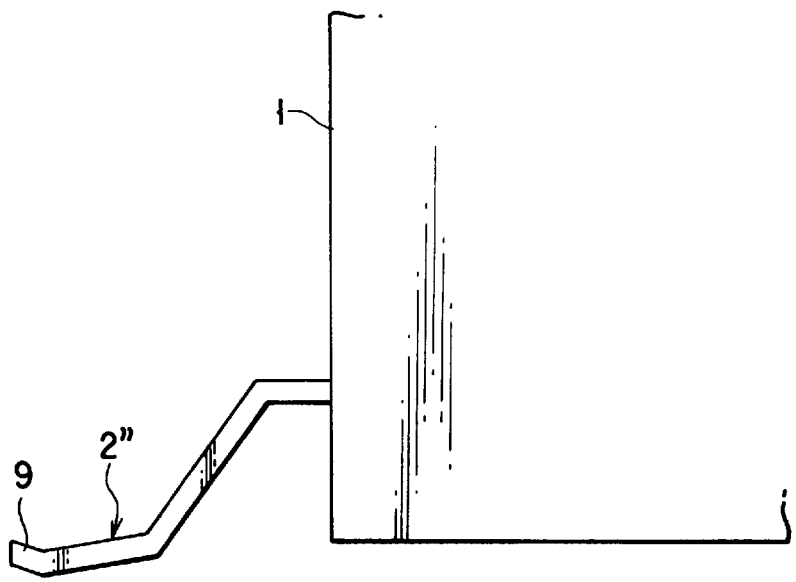
FIG. 7 is an enlarged view showing the electrical connection terminal portion in the third embodiment.

In this embodiment, therefore, the tip end portion 9 of the lead terminal is deformed as shown in FIG. 7 so as to prevent the tip end portion 9 from directly contacting with the board. It makes it difficult that the tip end portion 9 of the lead terminal catches the board and the lead terminal functions like a prop to prevent the phenomenon of shifting the position of the package from occurring.

The deformation of the tip end portion of the lead terminal can be realized only by molding the lead terminal or deforming part of the die in the cutting step. Thus, it does hardly cause a cost hike problem. Rather, when mounting the terminal on the board, solders of two portions, that is, the package side of the lead and the tip end portion thereof, become thicker by the surface tension action of solders. As a result, such advantages as a reduction in the number of soldering defects, an increase in connection area and an improvement in fixing strength are produced.

[Fourth Embodiment]

Figure 8:
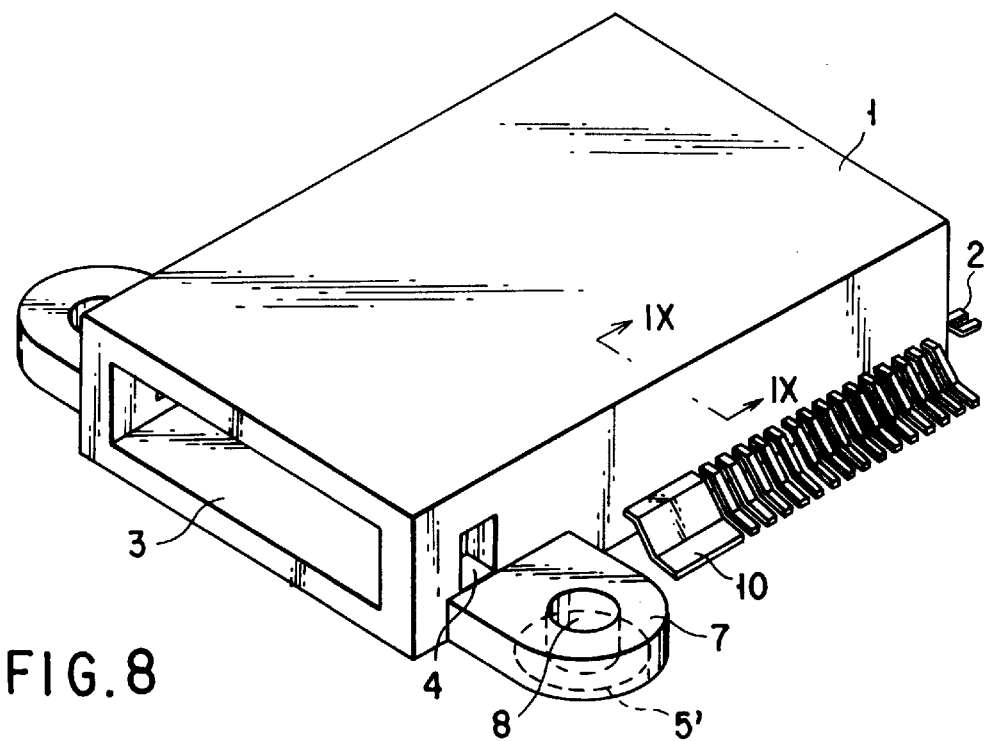
FIG. 8 is a perspective view showing the structure of the connector type semiconductor package in the fourth embodiment.

FIG. 8 is a perspective view showing the structure of the appearance of the connector type semiconductor package in the fourth embodiment according to the present invention. In FIG. 8, so-called gull-wing type lead terminals 2 which are surface mount type electrical connection terminals used for the normal QFP, a connector receptacle 3 which is a signal connection connector insertion portion, a connector lock hole 4, a step 5' for determining the height of the electrical connection terminals 2, a fixing portion 7 for screw-fixing the package to the board, a screw hole 8 and an auxiliary terminal 10 are provided in a package main body 1.

This embodiment illustrates a case where screw stress applied when screw-fixing of the fixing portion 7 is reduced to thereby make it difficult to apply the stress onto the electrical connection terminals 2. In other words, the external force caused by connection disconnect after screw-fixing the package to the board can be absorbed by the fixing portion 7 and the fixing screw in the preceding embodiments. However, the external force given when installing the fixing screw itself is applied to the terminals 2 and the force, which turns into stress, disadvantageously continues to be applied until the fixing screw is removed.

Considering this disadvantage, the auxiliary terminal 10 is provided for relaxing the external force during screw-fixing in this embodiment. The size of the auxiliary terminal 10 can be made large so far as the package area permits. By so doing, not only the same effect as that in the first embodiment but also a further improvement in connection reliability by reducing the stress applied to the connection terminals while screw-fixing the package to the board, can be attained. As described in the third embodiment, if the tip end portion of the lead terminal is deformed to prevent the tip end portion from directly contacting with the board, the effect of the third embodiment can be also attained in this embodiment.

Figure 9:
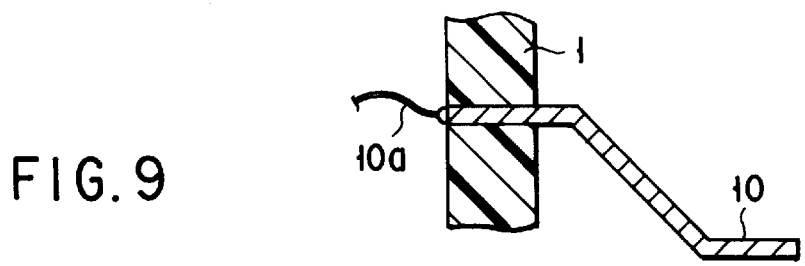
FIG. 9 is partially cross-sectional view taken along lines IX—IX of FIG. 8.

The auxiliary terminal 10 may be molded at the package main body 1 in the same manner as the terminal 1 as shown in FIG. 9. The auxiliary terminal 10 can also function as a ground, a power supply or a shield if a conductor 10a is connected thereto.

Figure 10:
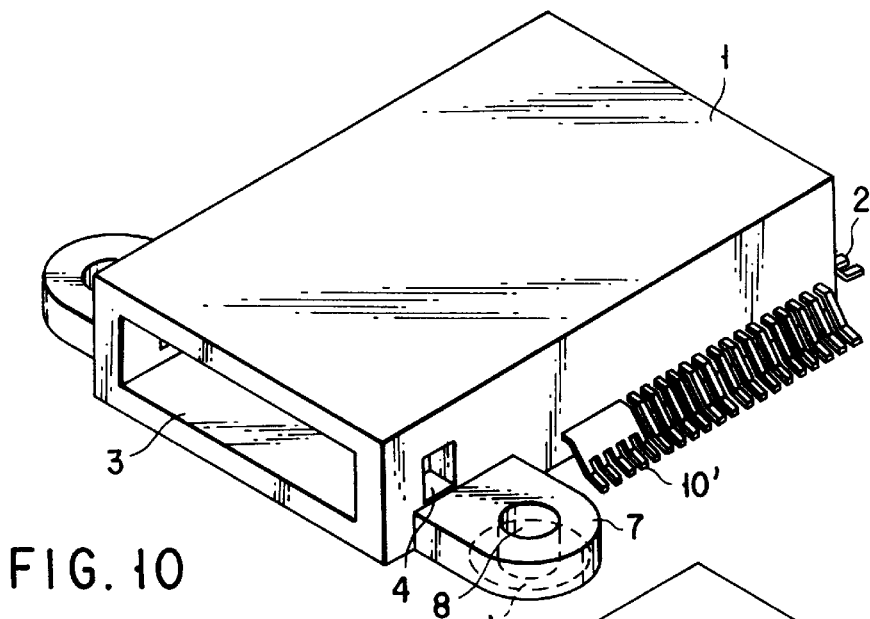
FIG. 10 is a perspective view showing a modified version of the fourth embodiment.
Figure 11:
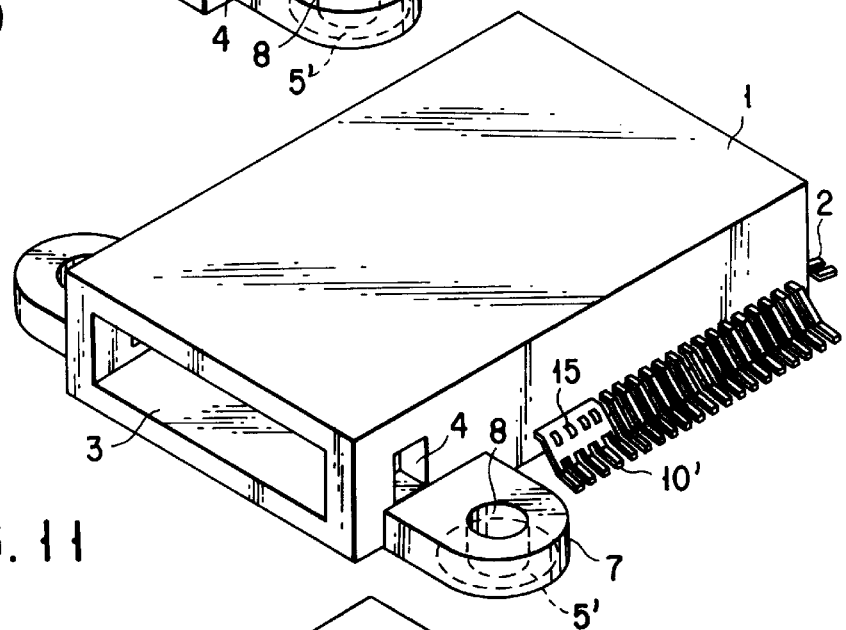
FIG. 11 is a perspective view showing another modified version of the fourth embodiment.

If a large auxiliary terminal 10 is simply provided, solders might be absorbed or unevenly provided when the package is soldered to the board. This problem can be solved by making the board connection surface of the auxiliary terminal 10 have the same shape as those of the electrical connection terminals 2 as shown in FIG. 10. Furthermore, when the auxiliary terminal 10 is bent during frame cutting, strong force is applied to the auxiliary terminal 10. This might prevent all of the other terminals from being uniformly bent. However, as shown in FIG. 11, this problem can be solved by providing opening portions 15 having the same width as that between electrical connection terminals 2 to the bent portions of the auxiliary terminal 10 at the package main body side.

[Fifth Embodiment]

Figure 12:
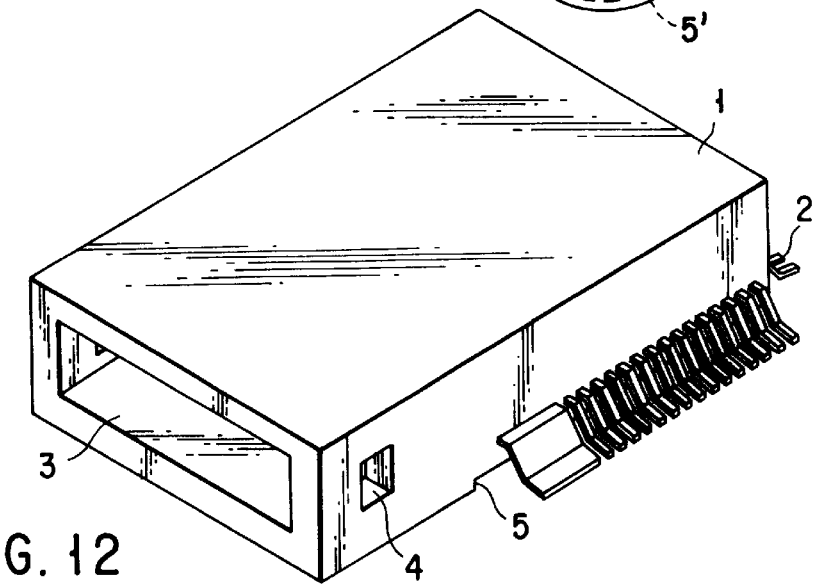
FIG. 12 is a perspective view showing the structure of the connector type semiconductor package in the fifth embodiment according to the present invention.

FIG. 12 is a perspective view showing the structure of the appearance of the connector type semiconductor package in the fifth embodiment according to the present invention. As shown in FIG. 12, so-called gull-wing type lead terminals 2 which are surface mount type electrical connection terminals used for the normal QFP, a connector receptacle 3 which is a signal connection insertion portion, a lock hole 4, a step 5' for determining the height of the electrical connection terminals 2 and an auxiliary terminal 10 are provided in a package main body 1.

As in the case of the fourth embodiment, this embodiment illustrates a case where screw stress applied when screw-fixing of the fixing portion 7 is reduced to thereby make it difficult to apply the stress onto the electrical connection terminals 2.

In this embodiment, an auxiliary terminal 10 is likewise provided for relaxing the external force. The size of the auxiliary terminal 10 can be made large so far as the package area permits. By so doing, not only the same effect as that in the first embodiment but also a further improvement in connection reliability by reducing the stress applied to the connection terminals while fixing the package to the board, can be attained in this embodiment. As described in the third embodiment, if the tip end portion of the lead terminal is deformed to prevent the tip end portion from directly contacting with the board, the effect of the third embodiment can be also attained in this embodiment.

[Modification Example]

The present invention should not be limited to the above-described embodiments. The third embodiment is characterized in that the tip end portion of a lead terminal is deformed to prevent the tip end portion from directly contacting with a board. Therefore, according to the third embodiment, a step is not necessarily provided at the package main body unlike the first embodiment. The third embodiment can be applied to the structure where the electrical connection terminals are arranged asymmetrically around the package main body. Moreover, the fourth embodiment is characterized by providing an auxiliary terminal to relax the external force given when screw-fixing the package to the board. Therefore, according to the fourth embodiment, a step is not necessarily provided at the package main body unlike the first embodiment.

Furthermore, the step provided at the connector insertion side of the package main body is not necessarily provided by forming the overall connector insertion side on the base of the package into a convex shape. Instead, only part of the connector insertion side may be made into a convex shape. In addition, various modifications to the present invention can be made without departing from the spirit of the present invention.

As described so far, the present invention can realize a connector type semiconductor package having a smallest mounting area and including many connection terminals, and can provide interface parts having large wiring capacity between the boards. Accordingly, the present invention can greatly contribute to improvements in the performance of large capacity information processing and of communications exchange system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A connecting semiconductor package to be mounted on a board comprising:
    a package main body;
    a package mounting surface on said package main body, a connection direction of a signal connection connector being parallel to said package mounting surface;
    a connector insertion portion provided in said package main body, said signal connection connector detachably inserted into said connector insertion portion;
    surface mount electrical connection terminals provided on said package main body; and
    a step provided at a side where the connector insertion portion of said package main body is provided, said step being configured to support a front portion of said package main body against said board so that a back portion is floating above said board.

2. A connecting semiconductor package according to claim 1, wherein said connector insertion portion is provided at one side portion of said package main body.

3. A connecting semiconductor package according to claim 1, wherein said surface mount electrical connection terminals are provided at a side portion other than the one side portion of said package main body.

4. A connecting type semiconductor package according to claim 1, wherein said step is provided on the package mounting surface of said package main body at a side where said connector insertion portion is provided.

5. A connecting semiconductor package according to claim 1, further comprising a screw installation hole provided in said package main body for reinforcing installation strength of said package main body, and wherein
    said step is at least provided at a portion surrounding said screw installation hole.

6. A connecting semiconductor package according to claim 1, further comprising a screw hole provided in said package main body for reinforcing installation strength of said package main body, and wherein
    said step is at least provided at a portion surrounding said screw hole.

7. A connecting type semiconductor package according to claim 1, wherein
    the height of said surface mount electrical connection terminals is variable by application of pressure onto the package during package mounting, and
    said step is set to the height of said surface mount type electrical connection terminals after package mounting.

8. A connecting semiconductor package according to claim 1, wherein said step is a convex portion formed at a connector insertion side on the mounting surface of said package main body.

9. A connecting semiconductor package according to claim 8, wherein said convex portion is a portion partly formed at the connector insertion side on the mounting surface of said package main body.

10. A connecting semiconductor package according to claim 1, wherein a height of said step is determined by a package floating degree.

11. A connecting semiconductor package according to claim 1, wherein a height of said step is substantially 0.1 mm.

12. A connecting semiconductor package comprising:
    a package main body;
    a package mounting surface on said package main body, a connection direction of a signal connection connector being parallel to said package mounting surface;
    a connector insertion portion provided in said package main body, said signal connection connector detachably inserted into said connector insertion portion; and
    electrical connection terminals arranged asymmetrically around said package main body, wherein
    each of said electrical connection terminals comprises:
        an intermediate portion configured to come in contact with a board on which said connecting semiconductor package is mounted, and
        a tip portion above said intermediate portion and configured to be out of contact with the board.

13. A connecting semiconductor package according to claim 12, wherein said electrical connection terminals are surface mount electrical connection terminals.

14. A connecting semiconductor package according to claim 12, wherein said electrical connection terminals are bent in an upward direction of said package mounting surface.

15. A connecting semiconductor package according to claim 12, wherein the tip end portions of said electrical connection terminals are located in upper positions of a lowest portion.

16. A connecting type semiconductor package according to claim 12, wherein the tip end portions of said electrical connection terminals are located 0.1 mm higher than a lowest portion.

17. A connecting semiconductor package to be mounted on a board comprising:
    a package main body;
    a package mounting surface on said package main body, a connection direction of a signal connection connector is parallel to said package mounting surface;
    a connector insertion portion provided in said package main body, said signal connection connector detachably inserted into said connector insertion portion;
    surface mount electrical connection terminals provided on said package main body;
    a step provided at a side where a connection insertion portion of said package main body is provided, said step being configured to support a front portion of said package main body against said board so that a back portion is floating above said board; and
    a fixing auxiliary terminal provided at said package main body and capable of being fixed simultaneously with said surface mount electrical connection terminals.

18. A connecting semiconductor package according to claim 17, wherein said fixing auxiliary terminal has a shape formed by integrally coupling a plurality number of said surface mount electrical connection terminals.

19. A connecting semiconductor package according to claim 17, wherein said fixing auxiliary terminal has a same shape as those of said surface mount electrical connection terminals at a portion connected to said package mounting surface.

20. A semiconductor package to be mounted on a board and to be connected to a signal connection connector, comprising:
- a package main body having a connector insertion portion, and first and second frame portions;
- a connector insertion port formed in said first frame portion for detachably inserting the signal connection connector into said connector insertion portion;
- a first bottom surface for defining a mount level, said first bottom surface being arranged on a portion selected from the group consisting of said first frame portion and an additional portion connected to said first frame portion;
- a second bottom surface formed on said second frame portion and arranged on a level above said mount level; and
- electrical connection terminals extending downward from said second frame portion beyond said mount level, and arranged to be mounted on the board and in contact with the board, and to be capable of being deformed by a load so as to come into contact with the board on said mount level.

21. The package according to claim 20, wherein said first bottom surface is a bottom surface of said first frame portion.

22. The package according to claim 20, wherein said first bottom surface is a bottom surface of said additional portion, which is attached to said first frame portion and has a screw hole configured to fix said package to the board by a screw.

23. The package according to claim 20, wherein said electrical connection terminals extend from a side surface of said second frame portion.

24. The package according to claim 20, wherein each of said electrical connection terminals has an intermediate portion to come into contact with the board, and a tip portion arranged above said intermediate portion to be out of contact with the board.

25. The package according to claim 20, further comprising an auxiliary terminal extending downward from said second frame portion beyond said mount level, and arranged to be capable of being deformed by a load so as to come into contact with the board on said mount level, so as to reduce a stress applied to said electrical connection terminals.

26. The package according to claim 20, wherein said first frame portion comprises a first side surface corresponding to one of four side surfaces of a rectangular shape, on which said connector insertion port is arranged, and said second frame portion comprises second to fourth side surfaces corresponding to the other three of four side surfaces of said rectangular shape, on which said electrical connection terminals are arranged.

* * * * *